(12) United States Patent
Kelly

(10) Patent No.: US 9,143,089 B2
(45) Date of Patent: Sep. 22, 2015

(54) ACTIVE CASCODE CIRCUIT USING BACKGATE CONTROL

(71) Applicant: ANALOG DEVICES, INC., Norwood, MA (US)

(72) Inventor: Daniel F. Kelly, Andover, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 14/011,593

(22) Filed: Aug. 27, 2013

(65) Prior Publication Data

US 2014/0266437 A1    Sep. 18, 2014

Related U.S. Application Data

(60) Provisional application No. 61/780,598, filed on Mar. 13, 2013.

(51) Int. Cl.
    *H03F 1/22*     (2006.01)
    *H03F 3/45*     (2006.01)
    *H03F 3/68*     (2006.01)
    *H03G 3/00*     (2006.01)

(52) U.S. Cl.
    CPC .................. *H03F 1/22* (2013.01); *H03F 1/223* (2013.01); *H03F 3/45179* (2013.01); *H03F 3/45188* (2013.01); *H03F 3/68* (2013.01); *H03G 3/004* (2013.01)

(58) Field of Classification Search
    CPC .............. H03G 3/00; H03G 3/45; H03F 3/45; H03F 3/68
    USPC .................................. 330/253, 260, 278, 311
    See application file for complete search history.

(56) References Cited

U.S. PATENT DOCUMENTS

2001/0041548 A1*  11/2001  Bult et al. .................. 455/252.1
2002/0093382 A1    7/2002  Gupta

FOREIGN PATENT DOCUMENTS

| CN | 101340755 | 1/2009 |
| CN | 104049664 | 9/2014 |
| EP | 1227576   | 7/2002 |
| JP | 61-150505 | 7/1986 |

OTHER PUBLICATIONS

Pietro Monsurro et. al., "Exploiting the Body of MOS Devices for High Performance Analog Design", IEEE Circuits and Systems Magazine, IEEE Service Center, New York, NY, US, vol. 1. 11, No. 4, Jan. 1, 2011, pp. 8-23.*

(Continued)

*Primary Examiner* — Steven J. Mottola
*Assistant Examiner* — Hafizur Rahman
(74) *Attorney, Agent, or Firm* — Patent Capital Group

(57) ABSTRACT

An example embodiment of an active cascode circuit has a control circuit for control of the gate to source voltage (VGS) of at least one transistor in the active cascode circuit. The embodiment may be configured so that control of the VGS also controls the voltage Vin on the input. Vin may be adjusted without altering the device geometry or changing the drain current. This allows for better control and optimization of available headroom for the input voltage in low voltage designs and also results in higher active cascode circuit bandwidth and/or higher output impedance (Rout) for a given power level.

20 Claims, 13 Drawing Sheets

(56) References Cited

OTHER PUBLICATIONS

European Patent Office Search Report in EP14157101.8 mailed Jul. 8, 2014, 6 pages.

Pietro Monsurro et al., "Exploiting the Body of MOS Devices for High Performance Analog Design," IEEE Circuits and Systems Magazine, IEEE Service Center, New York, NY, US, vol. 11, No. 4, Jan. 1, 2011, pp. 8-23, XP011369898, ISSN: 1531-636X, DOI: 10.1109/MCAS.2011.942751.

Alireza Zabihian S. et al., "Ultra-Low-Voltage, Low-Power, High-Speed Operational Amplifiers Using Body-Driven, Gain-Boosting Technique," Circuits and Systems 2007, ISCAS 2007. IEEE International Symposium O N, IEEE, PI, May 1, 2007, pp. 705-708, XP031181358, IBSN: 978-1-4244-0920-4.

Office Action issued in Chinese Patent Application Serial No. 201410092504.0 mailed Mar. 16, 2015, 9 pages.

* cited by examiner

US 9,143,089 B2

ACTIVE CASCODE CIRCUIT USING BACKGATE CONTROL

PRIORITY DATA

This application claims the priority of Provisional Patent Application Ser. No. 61/780,598, filed Mar. 13, 2013, which is hereby incorporated by reference in its entirety.

TECHNICAL FIELD OF THE DISCLOSURE

This present disclosure relates generally to active cascode circuits and, more particularly, to an apparatus, method and system for implementing an active cascode circuit using backgate control.

BACKGROUND

Active cascode circuits are widely used in electronic circuits to improve the output impedance of current sources. Active cascode circuits are also used to improve the output impedance of differential pairs, and are widely used as a method of gain enhancement in amplifiers. Because active cascode circuits are widely used in the aforementioned and, also, in many other applications, it would provide an advantage to have an improved active cascode circuit.

OVERVIEW

This present disclosure relates generally to an apparatus, a system, circuitry, and a method for an active cascode circuit. According to an example embodiment, circuitry is implemented that provides an active cascode circuit having backgate control of at least one transistor in the circuit. In the embodiment, a control circuit is implemented that provides control of the backgate voltage which is used to adjust the gate to source voltage (VGS) of the at least one transistor. The active cascode circuit of the embodiment may be configured so that control of the VGS also controls the voltage Vin on the input. Vin may be adjusted without altering the device geometry or changing the drain current. The control circuit may be any type of circuitry that allows control of the backgate voltage.

An example embodiment of the active cascode circuit includes an input and an output, and a first transistor coupled between the input and the output and having a gate. The active cascode circuit further includes a load coupled between the gate of the first transistor and a first node, and a second transistor having a drain, a gate, a backgate and a source. The drain of the second transistor may be coupled to the gate of the first transistor, the gate of the second transistor may be coupled to the input, and the source of the second transistor may be coupled to a second node. A control circuit having a control output coupled to the backgate of the second transistor may be configured to provide a voltage on the backgate of the second transistor to control the VGS of the first transistor. The embodiment of the active cascode circuit may be implemented, for example, as parallel active cascode current sources or active cascode differential pairs. In the example embodiments, the control circuit may be configured to provide a variable or fixed voltage on the backgate of the second transistor during operation of the cascode circuit.

In another example embodiment, the active cascode circuit may include a current source coupled to the input of the active cascode circuit. In other example embodiments, parallel active cascode current sources or active cascode differential pairs may each be implemented to include a shared control circuit to control the backgate voltage for all of the plurality of active cascode circuits included in the current source or differential pair. In alternative embodiments a separate control circuit may be implemented for each of the plurality of active cascode circuits.

In another example embodiment, the control circuit for the active cascode circuit may be implemented as an operational amplifier configured to measure a input voltage at the input of the active cascode circuit, compare the input voltage of the active cascode circuit with a reference voltage and servo the backgate voltage of the second transistor to set the gate to source (VGS) voltage of the second transistor, and therefore the input voltage, to the reference voltage.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS OF THE DISCLOSURE

This present disclosure relates generally to an apparatus, a system, circuitry, and a method for an active cascode circuit. According to the example embodiments of the disclosure, circuitry may be implemented that provides an active cascode circuit having backgate control of at least one transistor in the circuit. Use of a control circuit to provide control of a backgate voltage of at least one transistor in the circuit provides an advantage in that the use of backgate control provides more degrees of freedom than may be available in conventional cascode circuits to set the gate source voltage (VGS) of the at least one transistor of the active cascode circuit. The control circuit may be any type of circuitry that allows control of the backgate voltage. By setting the VGS, the voltage Vin on the input can also be set without altering the device geometry or changing the drain current. This allows for better control and optimization of available headroom for the input voltage in low voltage designs and also results in higher active cascode circuit bandwidth and/or higher output impedance (Rout) for a given power level. The embodiments may be used, for example, to improve or modify the output impedance of a current source or to improve the output impedance of a differential pair implemented according to embodiments of the disclosure.

Figure 1:
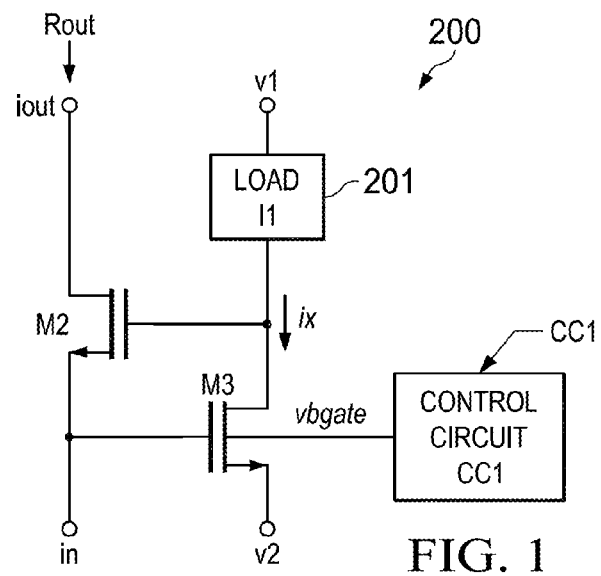
FIG. 1 illustrates an example active cascode circuit in accordance with an embodiment of the disclosure.

Referring now to FIG. 1, therein is illustrated an example active cascode circuit 200 according to an embodiment of the disclosure. Active cascode circuit 200 includes NMOS transistor M2, a common source amplifier, comprising NMOS transistor M3 and LOAD I1 201, and a control circuit CC1. In the embodiment of FIG. 1, the drain of transistor M2 may be coupled to the output "iout", the source of M2 may be coupled to the input "in", and the gate of M2 may be coupled to the drain of M3 and to the LOAD I1 201. LOAD I1 201 couples the gate of M2 and drain of M3 to a first node "v1". "v1" may be set at a first voltage potential. LOAD I1 201 may comprise a resistor, a transistor, a diode, a current source or any device which will allow M3's drain current to flow through. The gate of transistor M3 may be coupled to the input "in", the drain of M3 may be coupled to the LOAD I1 201, and the source of M3 may be coupled to a second node "v2". "v2" may be set to a second voltage potential different from the voltage potential of "v1". In active cascode circuit 200, M3 may have a separate backgate connection which may be coupled to a control output that is controlled by the control circuit CC1 to adjust the voltage Vt of M3. As the backgate voltage of M3 is changed by CC1, the gate to source voltage (VGS) must also change to maintain the needed VGS-Vt to sink the drain current ix from LOAD I1 201. The backgate voltage vbgate is set by control circuit CC1 having at least one terminal connected to the backgate terminal of M3. The control circuit may be any circuit which can produce an output voltage vbgate. The output of the control circuit vbgate may be a fixed or variable voltage. This allows control of vbgate such that a fixed VGS or a variable VGS on M3 may be created. The voltage vbgate may be either a positive or negative voltage to provide for decreasing or increasing the VGS of M3.

Figure 2:
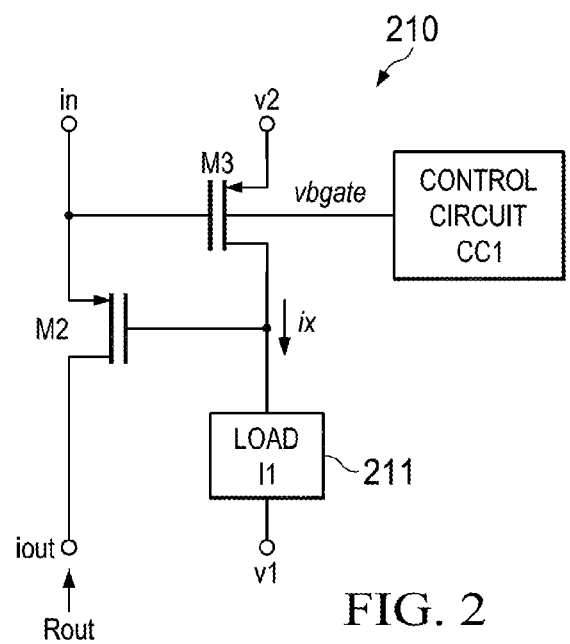
FIG. 2 illustrates an example active cascode circuit in accordance with an embodiment of the disclosure.

The LOAD I1 201 can be a current source, resistor, transistor, diode, NMOS or PMOS device or any device through which a current may flow to provide a drain current (ix) for M3 so that gain can be achieved at the drain of M3. Though the embodiment shown FIG. 1 is implemented using NMOS devices, the embodiment may also be implemented using PMOS devices to implement active cascode circuit 210 as shown in FIG. 2.

Figure 3A:
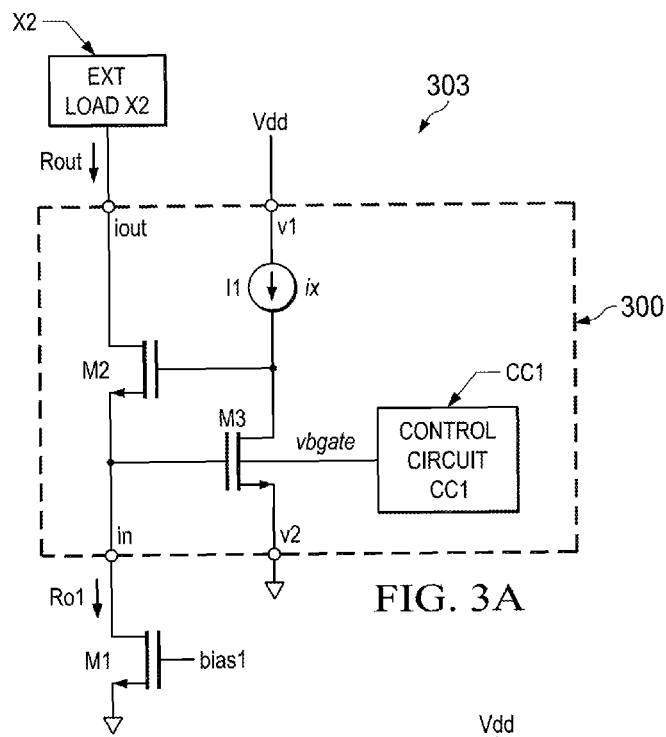
FIGS. 3A and 3B illustrate example active cascode current sources implemented according to an embodiment of the disclosure.

Referring now to FIG. 3A, therein is illustrated an implementation of an example active cascode current source 303 according to an embodiment of the disclosure. FIG. 3A shows an implementation of active cascode circuit 300 that provides an active cascode current source 303. M1 may be an NMOS current source with output impedance Ro1 which may be cascoded with active cascode circuit 300. Active cascode circuit 300 may be implemented similar to the embodiment of FIG. 1 with the addition of transistor M1 and external load EXT LOAD X2. In the embodiment of FIG. 3A the node "v1" may be set to the voltage Vdd and the node "v2" may be set to ground potential. The gate of M1 may be driven by a bias voltage "bias1" which sets up a current in M1. X2 is a load which the output current flows. X2 could be an external device such as a resistor, diode, transistor, current source, voltage source, supply or any device through which current can flow. In alternative embodiments the current source comprising M1, may be implemented by, for example, any type of current source that includes one or more components or devices, where the components or devices could comprise a resistor, transistor, diode or any device which provides a source of current to the input.

In FIG. 3A active cascode circuit 300 of the embodiment will serve as an active cascode for M1. Active cascode circuit 300 includes cascode device M2, a common source amplifier, comprising M3 and I1, and a control circuit CC1. M3 has a separate backgate connection which may be driven by the control circuit to adjust the Vt of M3. M3 has output impedance Ro3 and transconductance gm3. Assuming I1 has a much higher output impedance than M3, the Rout of FIG. 3A may be given by, $$Rout = gm3*Ro3*(gm2*Ro2+1)*Ro1.$$

Figure 3B:
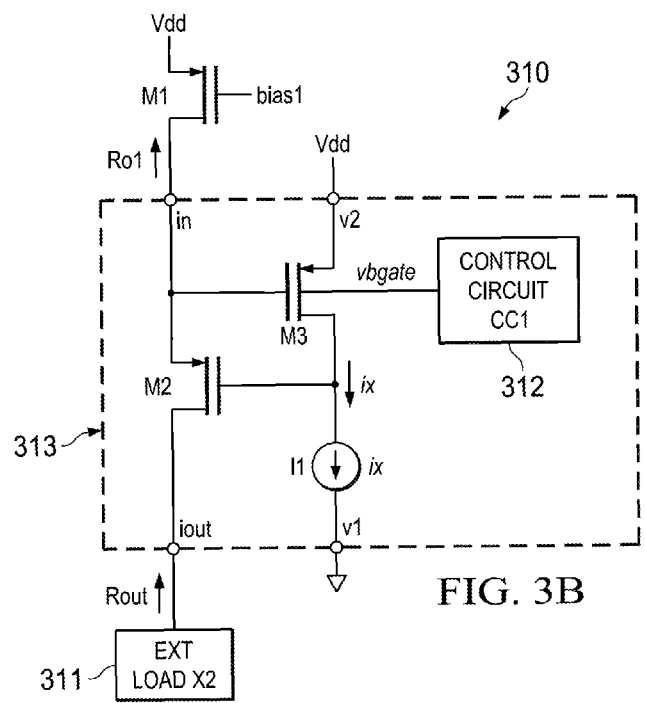

Use of the active cascode circuit 300 in active cascode current source 303 has at least several advantages. The VGS of device M3 may be set with the backgate voltage rather than by sub-optimal sizing or power which can degrade gain and bandwidth. The VGS of M3 also sets the voltage at node "in" which may be adjusted to optimize the available headroom of current source device M1 or any device connected to node "in". Also, active cascode circuit 300 may be adjustable over some range as determined by the control circuit CC1. Device M3 can be optimally sized because the control circuit can adjust the VGS of M3 via the backgate voltage without significantly degrading the gm3 of M3. Said another way, the backgate voltage provides one more degree of freedom to set the VGS without altering the device W/L or changing the drain current of M3. This results in higher bandwidth and higher Rout for active cascode current source 303 for a given power. Though FIG. 3A uses NMOS devices for M1, M2 and M3, the embodiment may also be implemented with PMOS devices as shown in FIG. 3B.

Figure 4A:
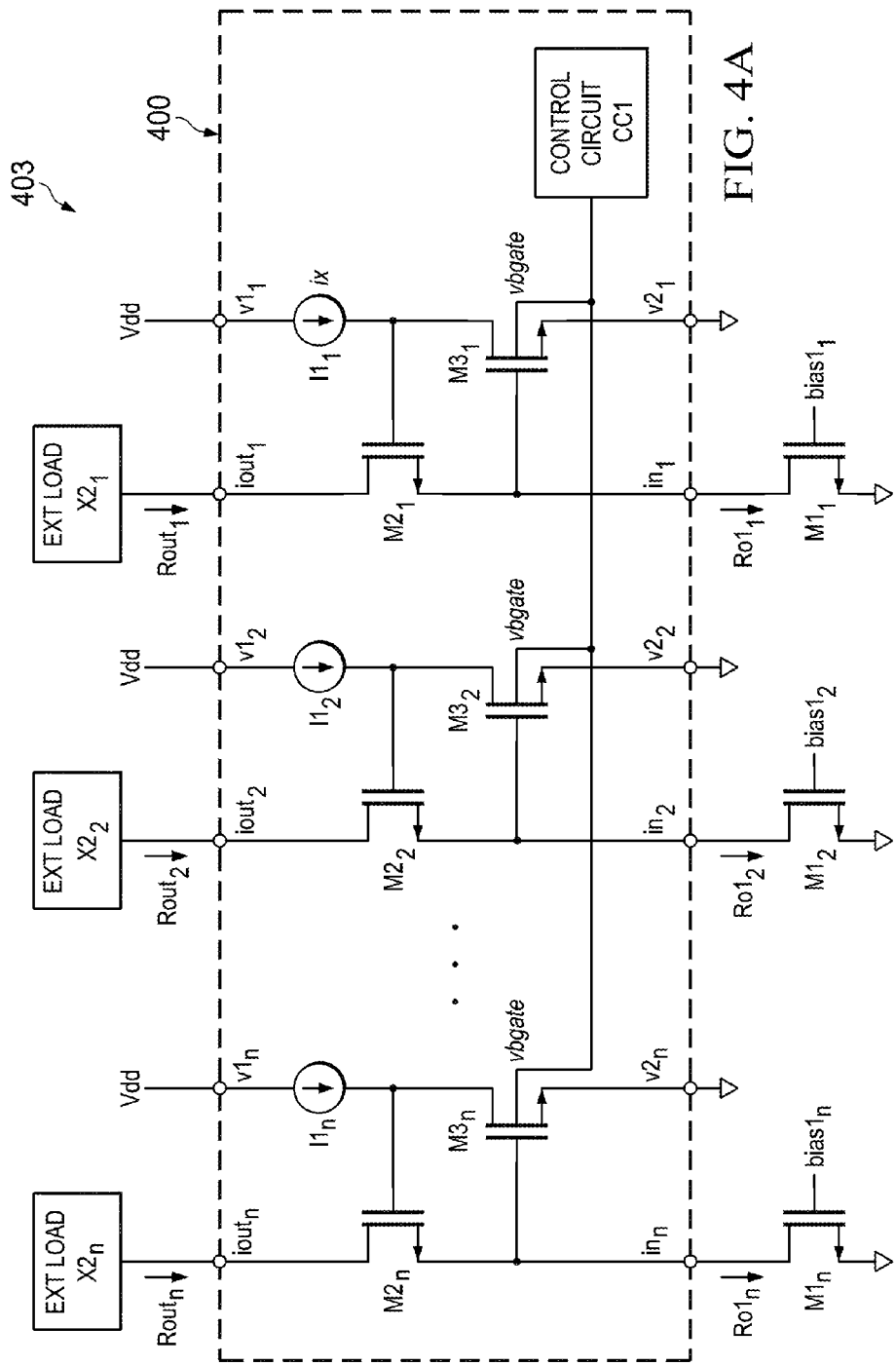
FIGS. 4A and 4B illustrate example multiple active cascode current sources implemented according to an embodiment of the disclosure.

Referring now to FIG. 4A, therein is illustrated example active cascode current sources 403 according to another embodiment of the disclosure. In the embodiment of FIG. 4A, n, active cascode circuits, where n may be any number, all sharing the same control circuit CC1, may be used to produce n active cascode current sources. In an alternate embodiment of FIG. 4A each of the active cascode circuits may have its own control circuitry. Active cascode current sources 403 comprises multiple active cascode circuits 400, each of which may be implemented similarly to active cascode circuit 300 of FIG. 3A. FIG. 4A shows multiple active cascode circuits 400, where each circuit n includes cascode device M2n, a common source amplifier circuit, comprising M3n and I1n. Control circuit CC1 is shared by each of the multiple active cascode circuits. M3n has a separate backgate connection which can be driven by the control circuit to adjust the Vt of M3n. In the embodiment of FIG. 4A, each active cascode circuit n may be coupled to a transistor M1n functioning as a current source.

Figure 4B:
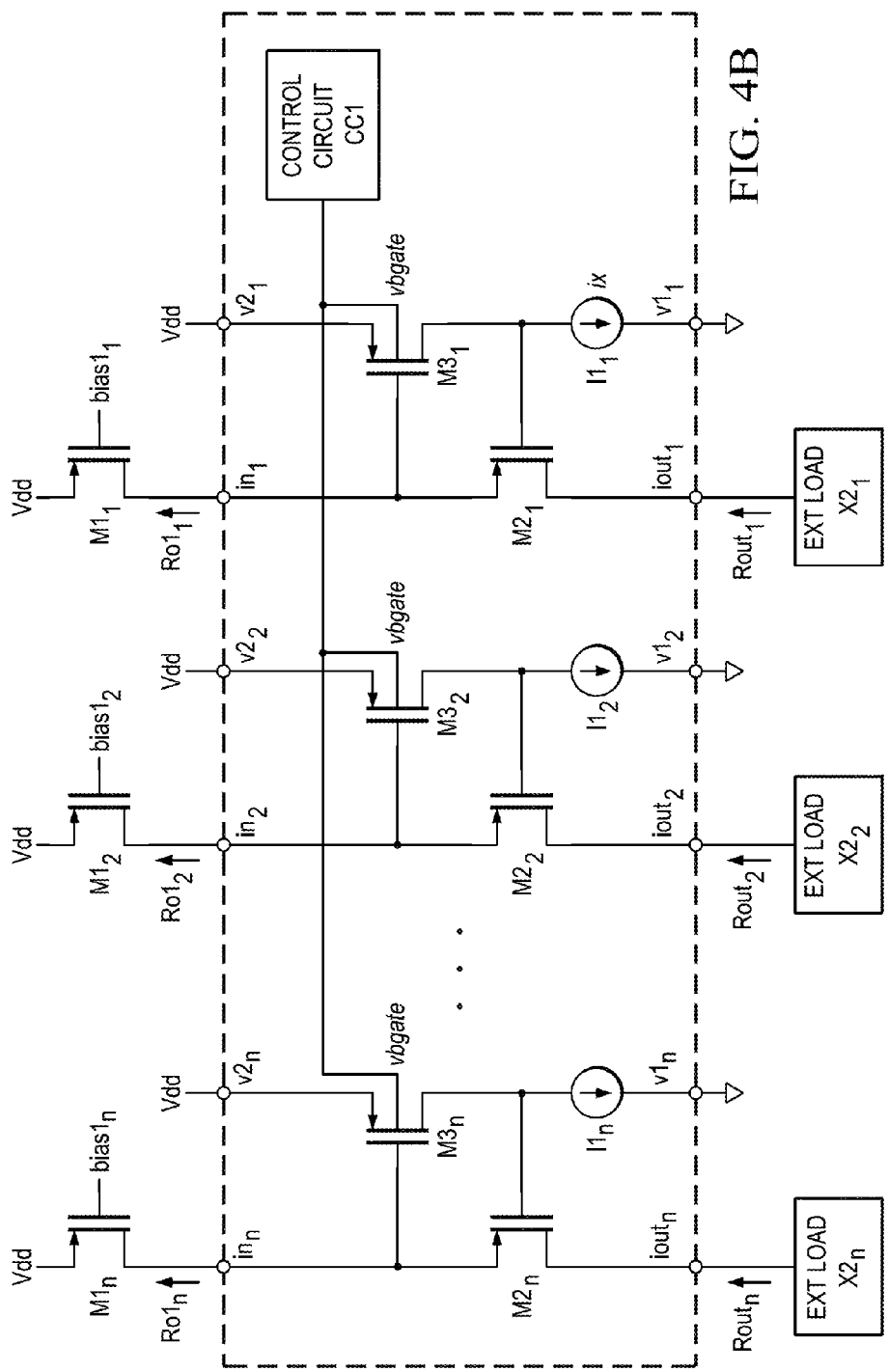

There are n active cascode circuits 400 ($M2_1$ to M2n, I1 to I1n, & $M3_1$ to M3n) in the active cascode current sources 403 which have backgate terminals whose vbgate may be driven from the same control circuit CC1. The circuit 403 produces n active cascode current sources and may have application in a current mirror circuit, for example. Again, a PMOS version of the embodiment, which is shown in FIG. 4B could be implemented by replacing all the NMOS with PMOS, changing the direction of current sources $I1_1$ to $I1_n$, and exchanging the Vdd and ground connections.

Figure 5A:
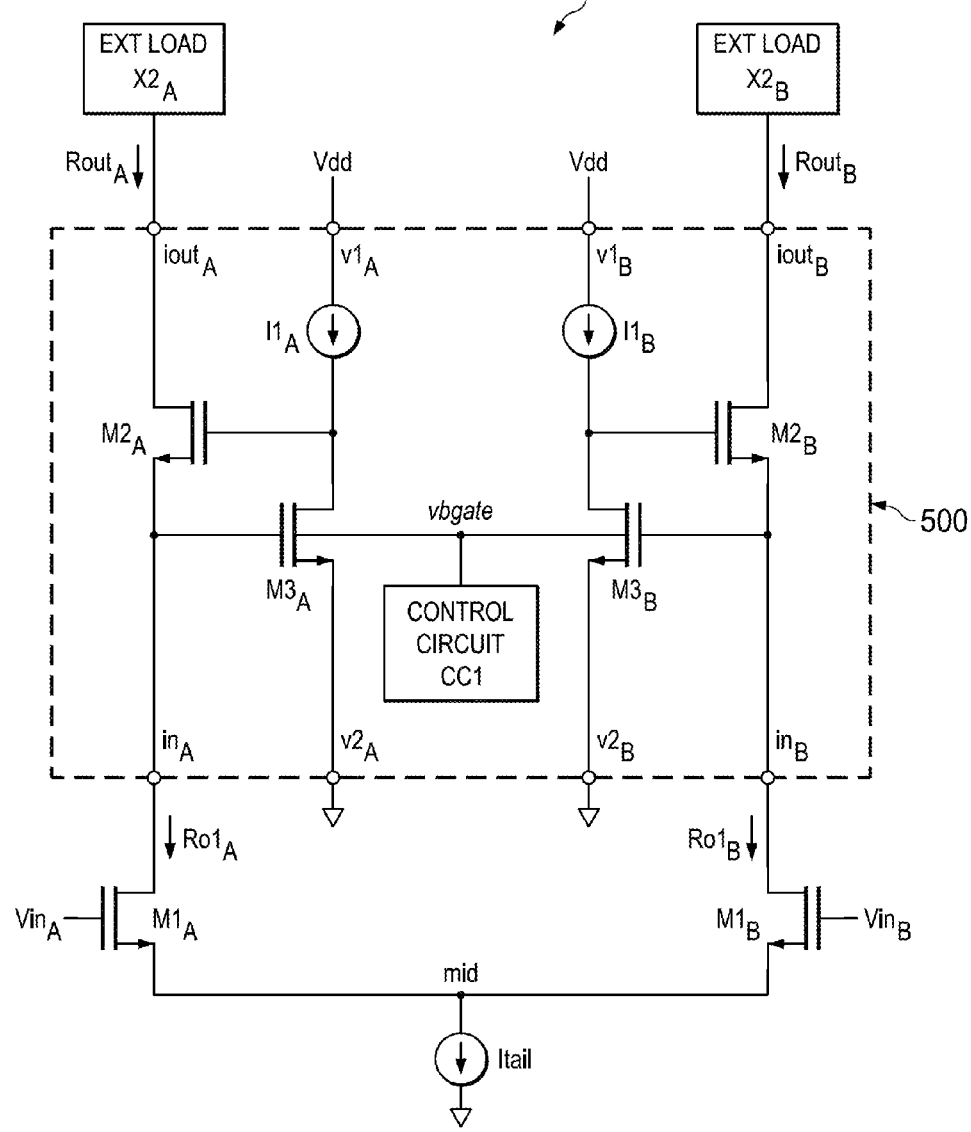
FIGS. 5A and 5B illustrate example active cascoded differential pairs implemented according to an embodiment of the disclosure; and, FIGS. 6A and 6B illustrate additional example active cascoded differential pairs implemented according to an embodiment of the disclosure.

Referring now to FIG. 5A, therein is illustrated an example active cascode differential pair 503 according to an embodiment of the disclosure. FIG. 5A shows active cascode circuits 500 which cascode differential pair 503 to improve the output impedance of the diff pair and thus provide gain enhancement when the output of the active cascoded differential pair drives differential load impedances to achieve gain such as in a differential amplifier. The differential pair may consist of tail current source Itail and input devices M1A and M1B. Use of the active cascode circuits 500 in the embodiment serves to increase the output impedance of the differential pair. Active cascode circuits 500 may comprise two copies of an active cascode circuit implemented similarly to active cascode circuit 300 of FIG. 3A which share a single control circuit CC1 to provide active cascodes for the diff pair. I1A, M3A and M2A form one active cascode circuit and I1B, M3B and M2B are a $2^{nd}$ active cascode circuit. The active cascodes may share the same control circuit CC1. In the embodiment of FIG. 5A the source terminals of M3A and M3B may be connected to $v2_A$ and $v2_B$, which are set at ground potential. The drain voltage of M1A may be set by the VGS of M3A. Control circuit CC1 creates voltage vbgate which drives the backgate of M3A and sets its VGS to the desired value. Similarly, the drain voltage of M1B may be set by the VGS of M3B. Control circuit CC1 creates voltage vbgate which drives the backgate of M3B and sets its VGS to the desired value. This allows the headroom on differential pair M1A, M1B and Itail to be set optimally and controlled by control circuit CC1 without the need for sub-optimal sizing of M3A, M3B, I1A and I1B which could degrade active cascade gain and bandwidth. In the embodiment, the resultant Rout of each side of the differential pair is improved by the gain of each active cascode amp.

$$RoutA = gm3A*Ro3A*(gm1*Ro1+1)*Ro1A,$$

$$RoutB = gm3B*Ro3B*(gm2*Ro2+1)*Ro1B$$

Figure 5B:
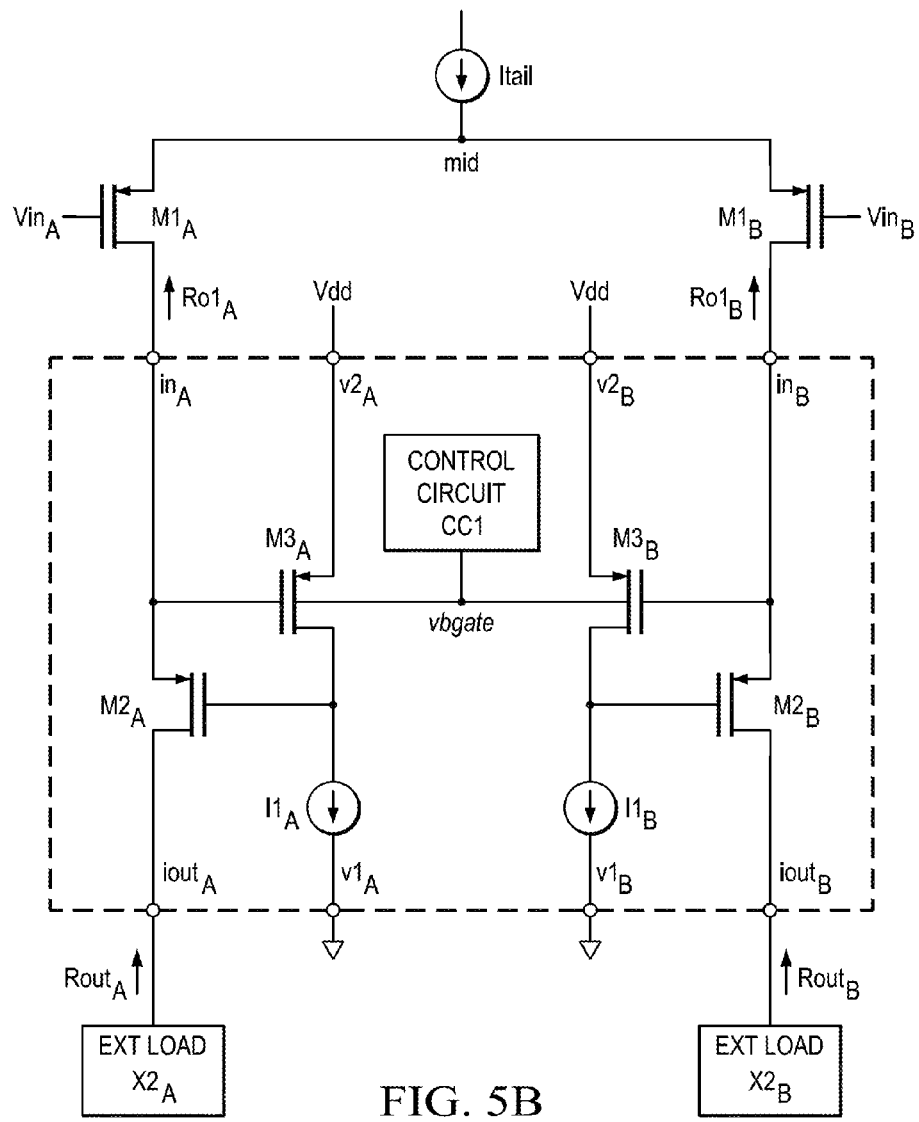

FIG. 5B shows a PMOS version of the embodiment.

Figure 6A:
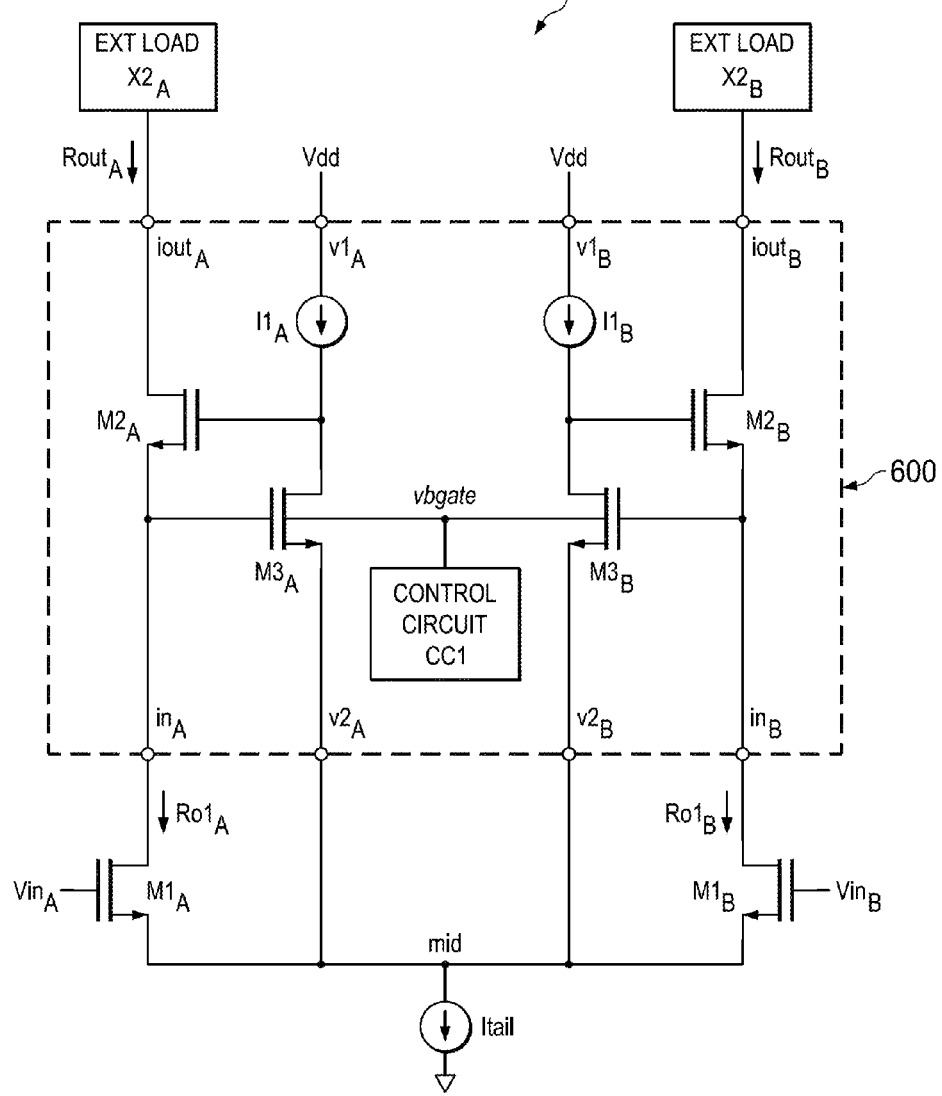

Referring now to FIG. 6A, therein is illustrated an example active cascode differential pair according to a further embodiment of the disclosure. FIG. 6A is another implementation using the active cascode circuit 300 to actively cascode a differential pair. The embodiment of FIG. 6A is implemented similarly to the embodiment of FIG. 5A with the exception that the source terminals of M3A and M3B may be connected to a common source node, mid, of the differential pair instead of ground. This "bootstrapping" using the node "mid" maintains a constant drain to source voltage (VDS) across the input devices M1A and M1B over a wider range of common mode input voltages.

Figure 6B:
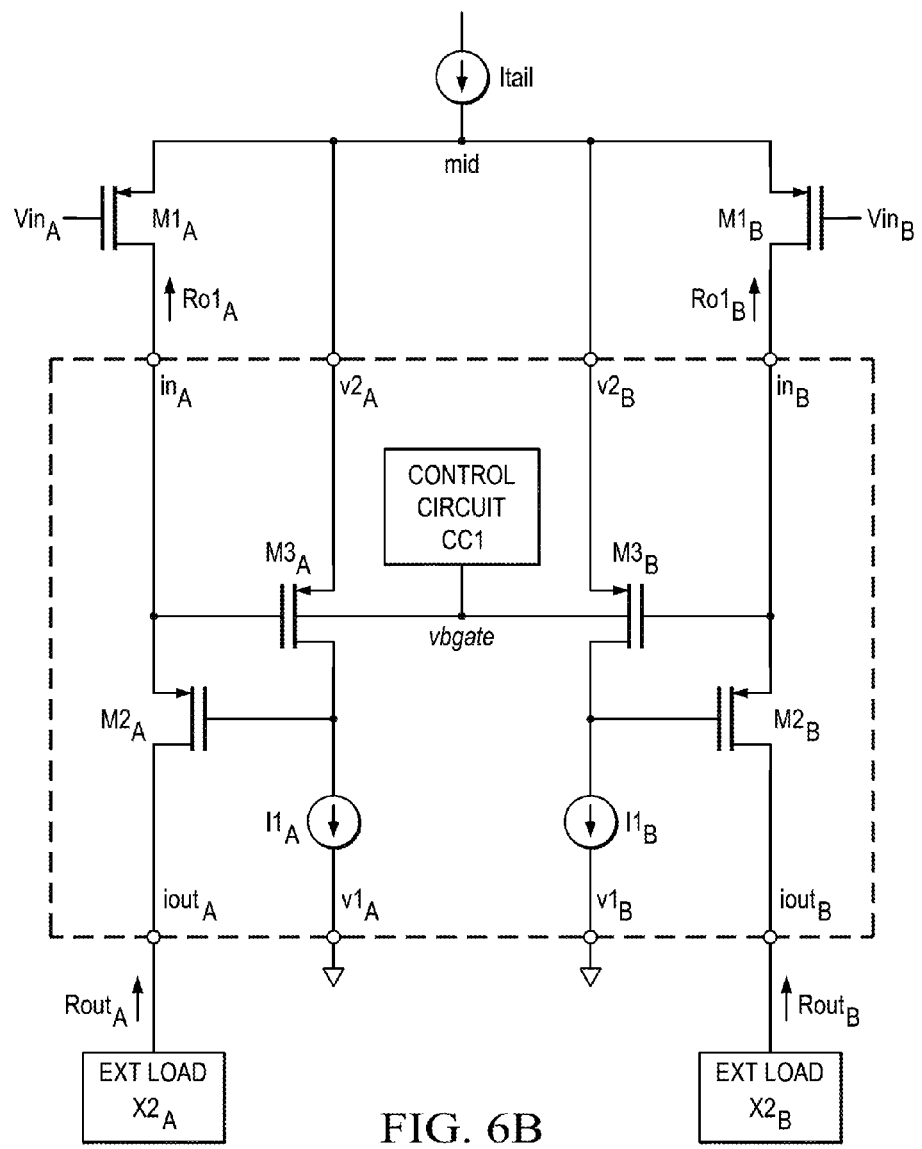

For each of the implementations of FIGS. 5A and 6A, which may be implemented in NMOS, a PMOS version a PMOS version is shown in FIGS. 5B and 6B, respectively.

Figure 7A:
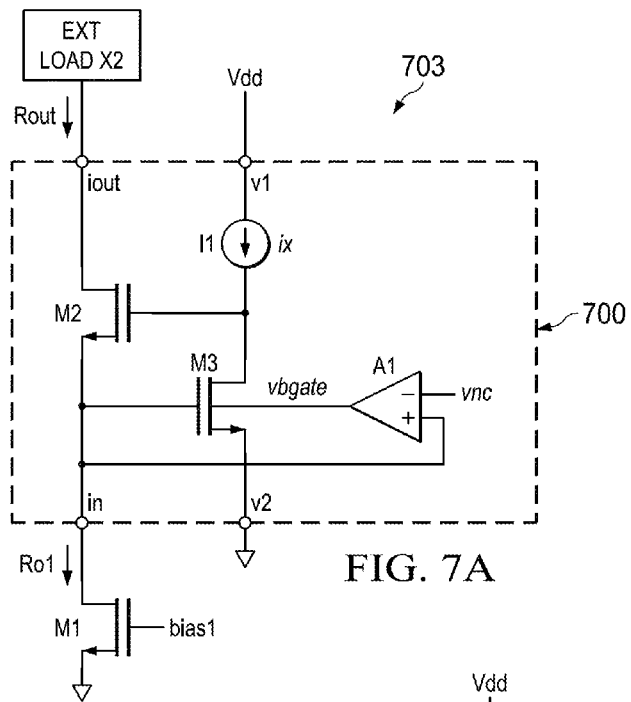
FIGS. 7A and 7B illustrate example active cascode circuits having an alternative control circuitry according to an embodiment of the disclosure.
Figure 7B:
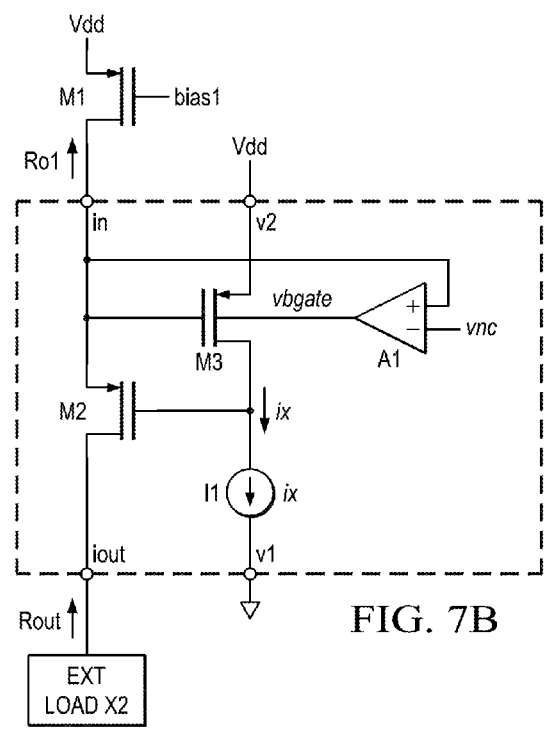

Referring now to FIG. 7A, therein is illustrated an embodiment of an active cascode circuit utilizing an Opamp control circuit according to an embodiment of the disclosure. Active cascode circuit 700 of FIG. 7A is a implementation of an active cascode circuit which may use opamp A1 to implement the control circuit implemented previously, for example, as CC1 of FIG. 1. In the embodiment of FIG. 7A, Opamp A1 may measure the voltage at node "in" which may be set by the VGS of M3. Opamp A1 then compares node "in" with a control reference voltage vnc and servos the vbgate voltage of M3 to set the VGS of M3 equal to vnc. The control reference voltage vnc may be a fixed or variable voltage derived from another circuit. The active cascode circuit 700 circuit has at least several advantages. The VGS of device M3 may be set using the backgate vbgate rather than by sub-optimal sizing or power which can degrade gain and bandwidth. Second, the VGS of M3 sets the voltage at node "in" which may be set and controlled for optimal headroom across current source device M1 or any other device connected to node "in". Third, the circuit may be adjustable over a range of vnc as set by the servo amp A1. A PMOS version of the embodiment is shown in FIG. 7B.

Figure 8A:
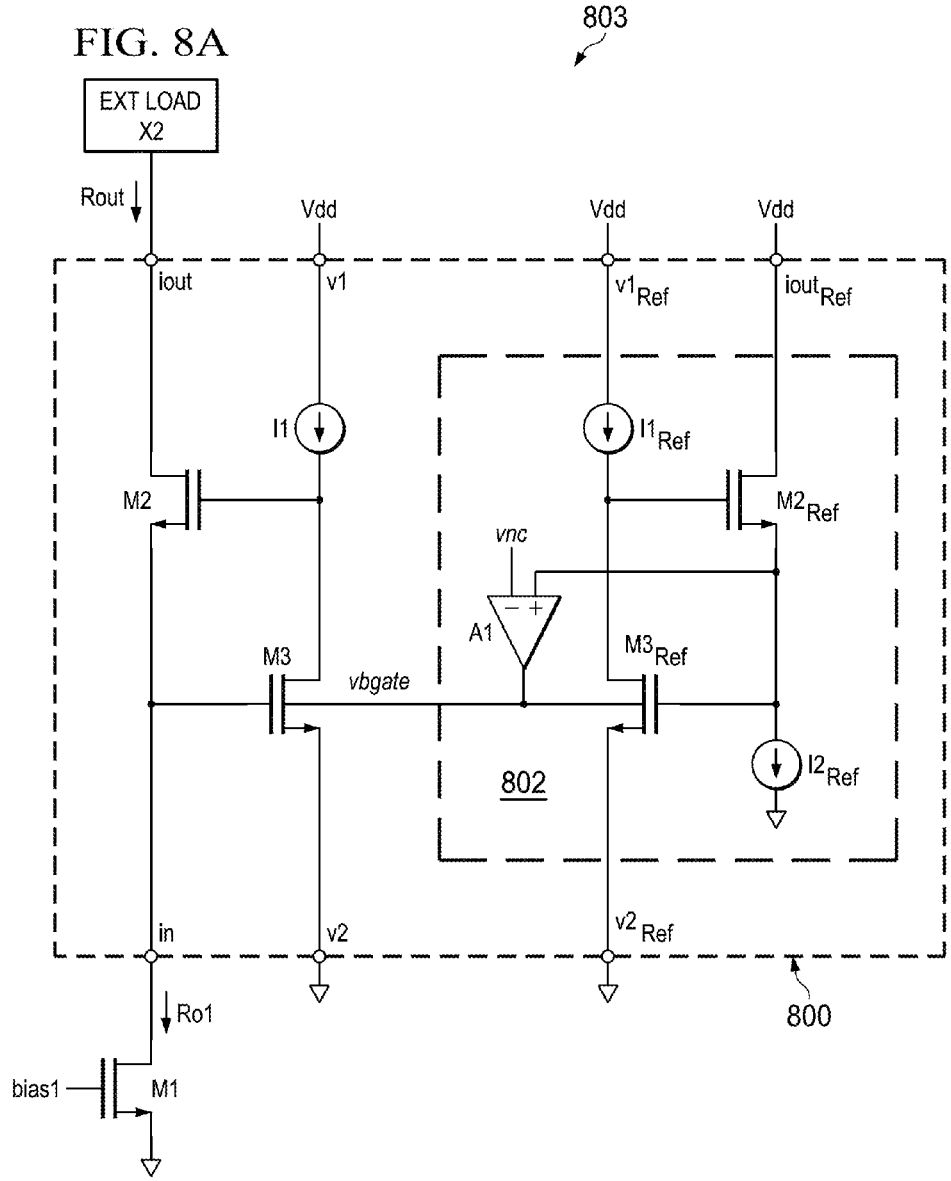
FIGS. 8A and 8B illustrate example active cascode circuits having a further alternative control circuitry according to an embodiment of the disclosure.
Figure 8B:
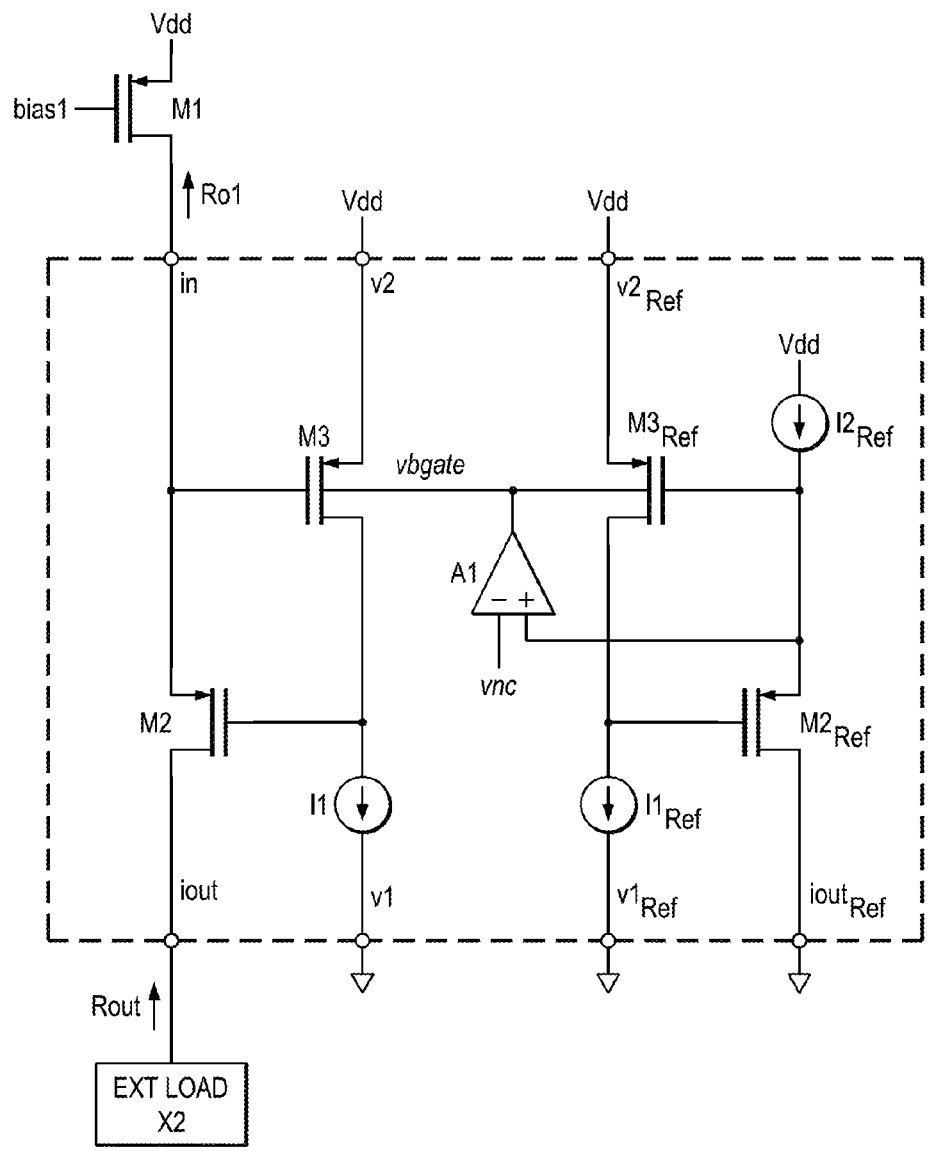

Referring now to FIG. 8A, therein is illustrated an example active cascode circuit 800 with a control circuit 802 according to a still further embodiment of the disclosure. FIG. 8A is an implementation of an active cascode circuit 800, which may be implemented similarly to active cascode circuit 300 of FIG. 3, in implemented with a control circuit 802 comprised of reference devices $I1_{Ref}$, $M3_{Ref}$, $I2_{Ref}$, $M^2Ref$ and opamp A1. In the embodiment Opamp A1 measures the VGS of $M3_{Ref}$ and drives the backgate of $M3_{Ref}$ until the VGS of $M3_{Ref}$ is equal to the control reference voltage vnc. The output of the control circuit 802 produces voltage vbgate which then may be used to drive the backgate of M3. In an implementation M3 and $M3_{Ref}$ may be sized to run at the same current density so that the VGS of M3 is equal to the VGS of $M3_{Ref}$ which is equal to the reference voltage vnc. The control reference voltage vnc may be a fixed or variable voltage derived from another circuit. A PMOS version of the implementation is shown in FIG. 5B.

Figure 9A:
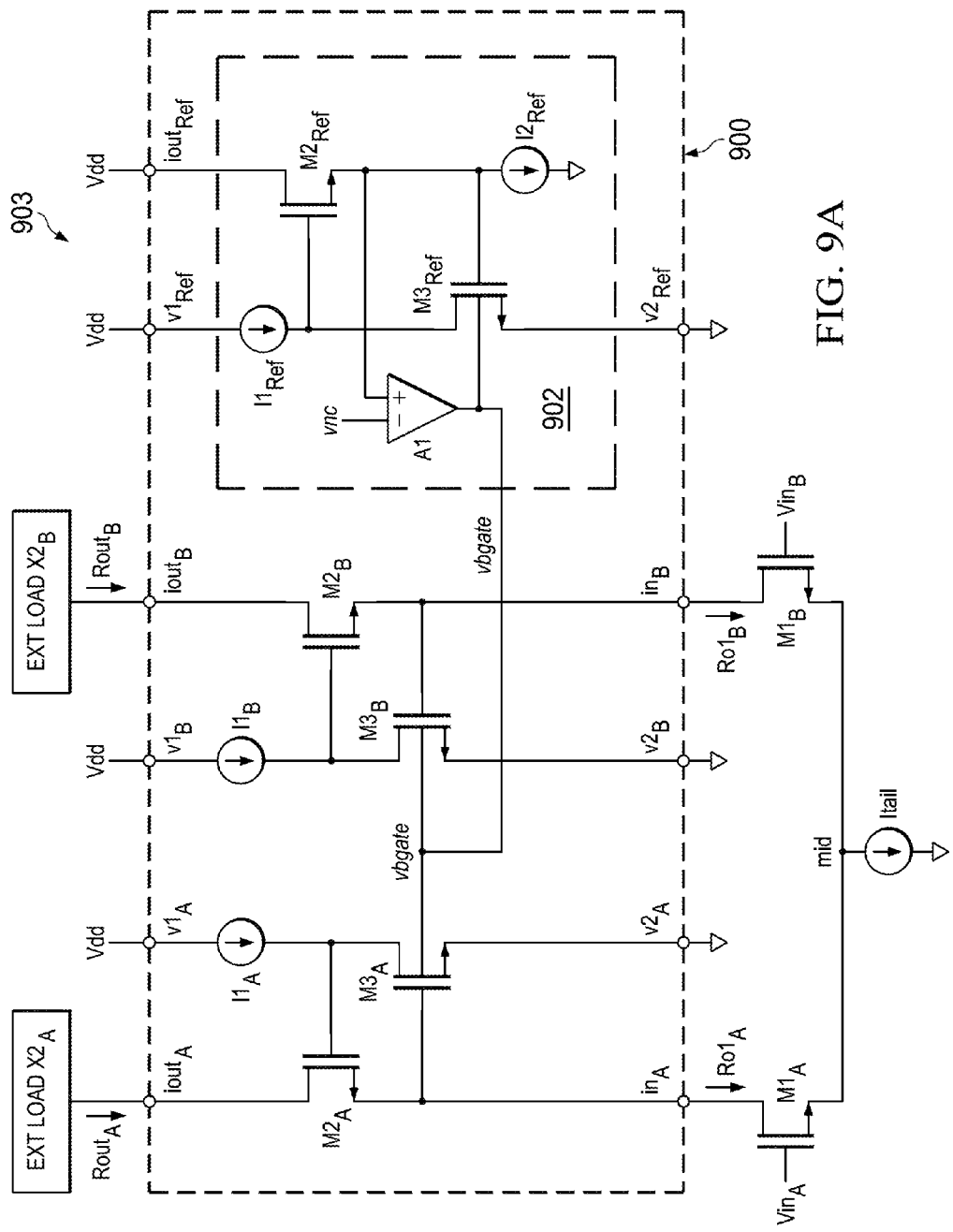
FIGS. 9A and 9B illustrate example active cascode differential pairs having control circuitry according to an embodiment of the disclosure.

Referring now to FIG. 9A, therein is illustrated an example of an embodiment of an active cascode circuit 900 for a differential amplifier 903 having a control circuit 902 according to an embodiment of the disclosure. The control circuit may be implemented similarly to control circuit 802 of the embodiment of FIG. 8A and may include a reference circuit with reference devices $I1_{Ref}$, $M3_{Ref}$, $I2_{Ref}$, $M2_{Ref}$ and opamp A1. In the embodiment of FIG. 9A, opamp A1 measures the VGS of $M3_{Ref}$ and drives the backgate of $M3_{Ref}$ until the VGS of $M3_{Ref}$ is equal to the control reference voltage vnc of A1. There are two active cascode circuits comprised of I1A, M3A, M1A and I1B, M3B, M2B, in the embodiment. The output of the control circuit 902 may produce a voltage vbgate which may then be used to drive the backgates of M3A and M3B. In an embodiment, M3A, M3B and $M3_{Ref}$ may be sized to run at the same current density so that the VGS of M3A and M3B are equal to the VGS of $M3_{Ref}$ which may be equal to reference voltage vnc. The control reference voltage vnc on A1 may be a fixed or variable voltage derived from another circuit. The active cascode circuit 900 improves the output impedance and sets the headroom of differential pair M1A, M1B and Itail similarly to the active cascode circuit 500 of FIG. 5A having all the same advantages of improved gain, bandwidth and headroom control as the circuit of FIG. 5A. The resultant Rout of each side of the differential pair is improved by the gain of each active cascode amp.

$$RoutA = gm3A*Ro3A*(gm1*Ro1+1)*Ro1A$$

$$RoutB = gm3B*Ro3B*(gm2*Ro2+1)*Ro1B$$

Figure 9B:
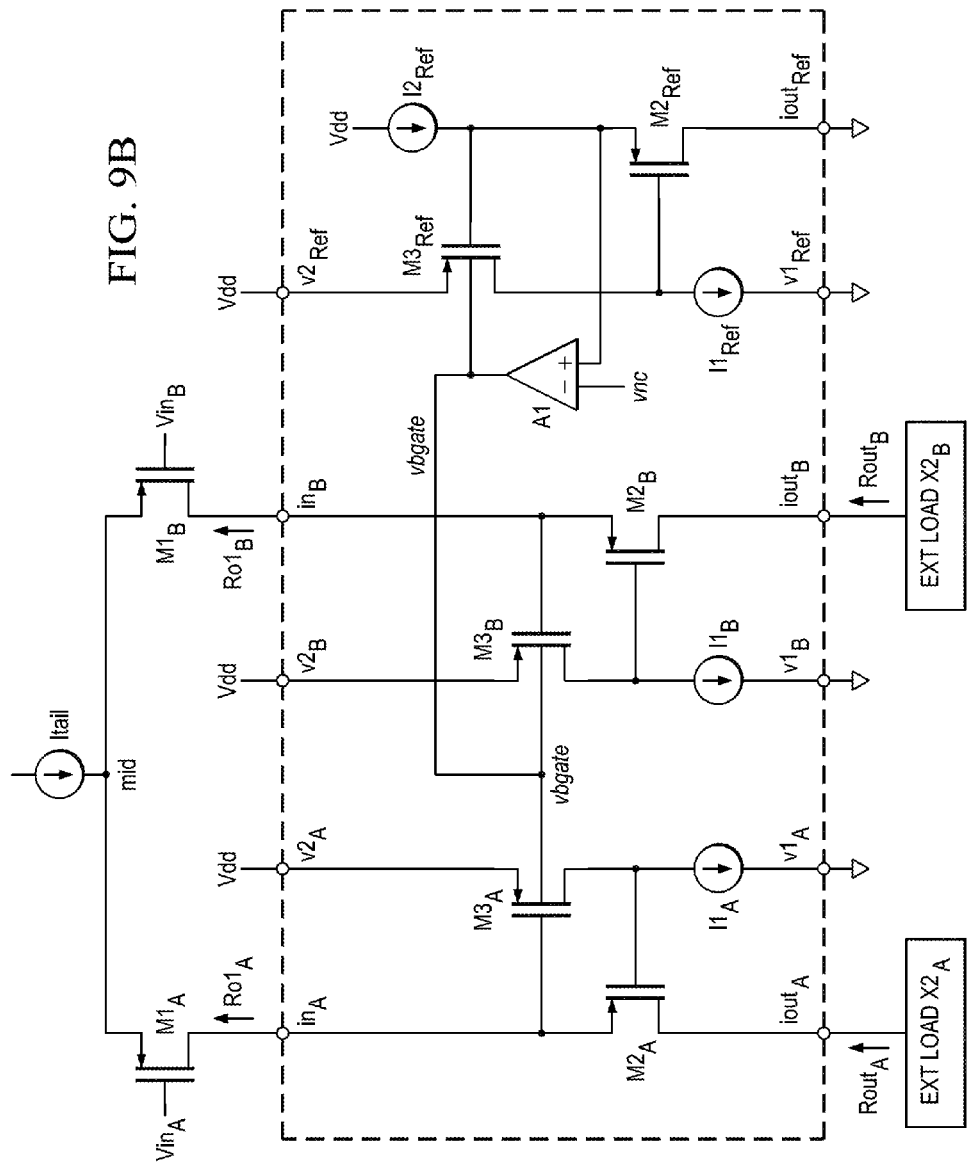

As in all the other examples, a PMOS version of the embodiment, shown in FIG. 9B, could be implemented.

In one example of the embodiments, any number of electrical circuits of the FIGURES may be implemented on a motherboard of an associated electronic device or in an integrated circuit. The integrated circuit can be for any appropriate use. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc. can be suitably coupled to the motherboard or integrated circuit based on particular configuration needs, processing demands, computer designs, etc. Other components such as external storage, additional sensors, controllers for audio/video display, and peripheral devices may be attached to the motherboard as plug-in cards, via cables, or integrated into the motherboard itself.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be substituted for and/or combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An active cascode circuit, comprising:
   an input and an output;
   a first transistor having a first terminal, a second terminal, and a gate, the first terminal coupled to the output and the second terminal coupled to the input, where the first terminal comprises a drain and the second terminal comprises a source;
   a load coupled between the gate and a first node;
   a second transistor having a backgate and a first, second and third terminal, the first terminal coupled to the gate, the second terminal coupled to the input, and the third terminal coupled to a second node;
   a control circuit having a control output coupled to the backgate of the second transistor, the control circuit configured to provide a voltage on the backgate of the second transistor to adjust the gate to source voltage (VGS) of the second transistor.

2. The active cascode circuit of claim 1, wherein the gate comprises a first gate, the drain comprises a first drain, the source comprises a first source, and the first, second, and third terminals of the second transistor comprise, respectively, a second drain, a second gate, and a second source.

3. The active cascode circuit of claim 2, wherein the control circuit is configured to provide a variable voltage on the backgate of the second transistor during operation of the cascode circuit.

4. The active cascode circuit of claim 2, wherein the first node is set to a first voltage potential and the second node is set to a second voltage potential.

5. The active cascode circuit of claim 4, further comprising a current source coupled to the input.

6. The active cascode circuit of claim 5, wherein the current source comprises a transistor coupled between the input and a third node and a having a third gate coupled to a bias voltage.

7. The active cascode circuit of claim 2, wherein the input and the output comprise a first input and first output, the load comprises a first load, the backgate comprises a first backgate, and wherein the active cascode circuit further comprises:
   a second input and a second output;
   a third transistor coupled between the second input and the second output and having a third gate;
   a second load coupled between the third gate and a third node; and,
   a fourth transistor having a third drain, a fourth gate, a second backgate and a third source, the third drain coupled to the third gate, the fourth gate coupled to the second input, and the third source coupled to a fourth node; and, the second backgate coupled to the control output of the control circuit; and,
   wherein the control circuit is further configured to provide a voltage on the first and second backgates to adjust the gate to source voltage (VGS) of the second and fourth transistor.

8. The circuit of claim 7, further comprising:
   a first current source coupled between the first input and a fifth node; and,
   a second current source coupled between the second input and a sixth node.

9. The circuit of claim 7, further comprising:
a differential pair having a fifth transistor coupled between the first input and a common source node and a sixth transistor coupled between the second input and the common source node.

10. The circuit of claim 9, wherein the second and fourth nodes couple the second and third sources to the common source node of the differential pair.

11. The circuit of claim 7, wherein the control circuit comprises:
an operational amplifier having a control output coupled to the backgates of the second and the fourth transistors, a minus input coupled to a reference voltage, and a plus input coupled to the second input.

12. The circuit of claim 2, wherein the control circuit comprises:
an operational amplifier configured to measure an input voltage at the input of the active cascode circuit, compare the input voltage with a reference voltage and serve the control signal to set the input voltage to the reference voltage.

13. The circuit of claim 2, wherein the control circuit comprises:
an operational amplifier having a control output coupled to the backgate of the second transistor, a minus input coupled to a reference voltage, and a plus input coupled to the input.

14. The circuit of claim 2, wherein the control circuit comprises:
a reference circuit comprising a third transistor having a backgate and a gate; and,
an operational amplifier having a control output coupled to the backgates of the second and the third transistors, a minus input coupled to a reference voltage, and a plus input coupled to the gate of the third transistor, the operational amplifier configured to the drive a control signal on the backgates of the second and third transistors to adjust the gate to source (VGS) voltage of the second and third transistors.

15. A method for providing an active cascode circuit, comprising:
providing a drain current through load to a second transistor;
receiving an input current on an input coupled to a gate of the second transistor and coupled to a second terminal of a first transistor;
providing an output current on an output coupled to the input through the first transistor by the output being coupled to a first terminal of the first transistor, where the first terminal comprises a drain and the second terminal comprises a source; and
controlling a backgate voltage on a backgate terminal of the second transistor to set the gate to source VGS voltage of the second transistor, wherein the VGS voltage determines the voltage Vin at the input.

16. The method of claim 15, wherein the controlling comprises providing a variable voltage to the backgate of the second transistor.

17. The method of claim 15, wherein the providing the drain current comprises:
providing the drain current through the load to the second transistor having a source coupled to the first node at a first voltage potential;
and, wherein, the receiving comprises:
receiving an input signal on an input coupled to a drain of a third transistor and to the gate of the second transistor, the third transistor having a source coupled to a node at a second voltage potential and providing a current source.

18. The method of claim 15, wherein the controlling comprises:
receiving a gate voltage of the second transistor at a plus input of an operational amplifier;
receiving a reference voltage at a minus input of the operational amplifier;
providing a control signal at the output of the operational amplifier to the backgate of the second transistor to set the gate to source voltage of the second transistor.

19. An active cascode circuit comprising:
means for providing a drain current through a load to a second transistor;
means for receiving an input current on an input coupled to a gate of the second transistor and coupled to a second terminal of a first transistor;
means for providing an output current on an output coupled to the input through the first transistor by the output being coupled to a first terminal of the first transistor, where the first terminal comprises a drain and the second terminal comprises a source; and
means for controlling a backgate voltage on a backgate terminal of the second transistor to set the gate to source (VGS) voltage of the second transistor, wherein the VGS voltage determines the voltage Vin at the input.

20. The active cascode circuit of claim 19, wherein the means for controlling comprises means for providing a variable voltage to the backgate of the second transistor.

* * * * *